(12) United States Patent
Tang

(10) Patent No.: US 6,263,007 B1
(45) Date of Patent: Jul. 17, 2001

(54) PULSED DISCHARGE GAS LASER HAVING NON-INTEGRAL SUPPLY RESERVOIR

(75) Inventor: Fuqian Tang, Orlando, FL (US)

(73) Assignee: T & S Team Incorporated, Orlando, FL (US)

( * ) Notice: Subject to any disclaimer, the term of this patent is extended or adjusted under 35 U.S.C. 154(b) by 0 days.

(21) Appl. No.: 09/200,005

(22) Filed: Nov. 25, 1998

Related U.S. Application Data (60) Provisional application No. 60/079,004, filed on Mar. 23, 1998.

(51) Int. Cl.[7] .............................. H01S 3/223; H01S 3/22
(52) U.S. Cl. .................................. 372/59; 372/60; 372/72
(58) Field of Search .................................. 372/59, 50, 60, 372/70, 71, 72

(56) References Cited

U.S. PATENT DOCUMENTS

| | | | |
|---|---|---|---|
| 4,550,408 | * 10/1985 | Karning et al. | 372/58 |
| 4,617,668 | * 10/1986 | Rudko et al. | 372/59 |
| 4,651,324 | * 3/1987 | Prein et al. | 372/59 |
| 4,719,641 | * 1/1988 | Muller et al. | 372/109 |

* cited by examiner

Primary Examiner—Robert H. Kim
Assistant Examiner—Delma R. Flores Ruiz
(74) Attorney, Agent, or Firm—Allen, Dyer, Doppelt, Milbrath & Gilchrist, P.A.

(57) ABSTRACT

A laser assembly, particularly one employing a gas lasing medium, has at least one lasing gas supply reservoir that is separate from the housing enclosure for the laser's optical cavity. A flexible or semi-flexible conduit supplies lasing gas from the reservoir to the optical cavity, so as to allow the laser per se and the gas reservoir to be manufactured separately and then connected by the tubing, thus simplifying the design and manufacturing process. The laser is preferably operated as a pulsed gas discharge laser that produces a continuous laser output. One or both of the laser's cavity mirrors may be coated with fine parallel lines which constrain the laser output to be linearly polarized. The lasing medium may have a stepwise or tapered structure, which provides for selection of the most desirable $TEM_{00}$ mode. In addition, the lasing medium cavity may be cooled by a multiple cooling jacket structure to facilitate placement of the coolant inlet and outlet ports.

17 Claims, 6 Drawing Sheets

PULSED DISCHARGE GAS LASER HAVING NON-INTEGRAL SUPPLY RESERVOIR

CROSS-REFERENCE TO RELATED APPLICATION

The present application claims the benefit of U.S. Provisional Application No. 60/079,004 filed Mar. 23, 1998.

BACKGROUND OF THE INVENTION

Figure 1:
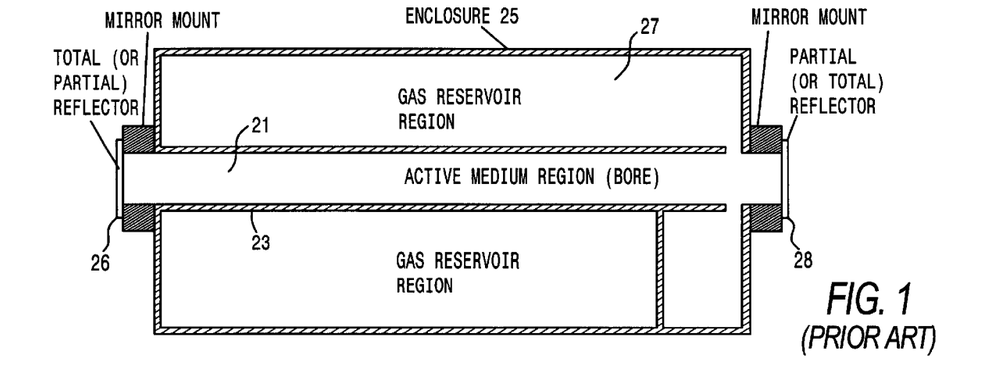
FIG. 1 diagrammatically illustrates a conventional sealed gas laser having a gas reservoir without a cooling jacket.
Figure 1A:
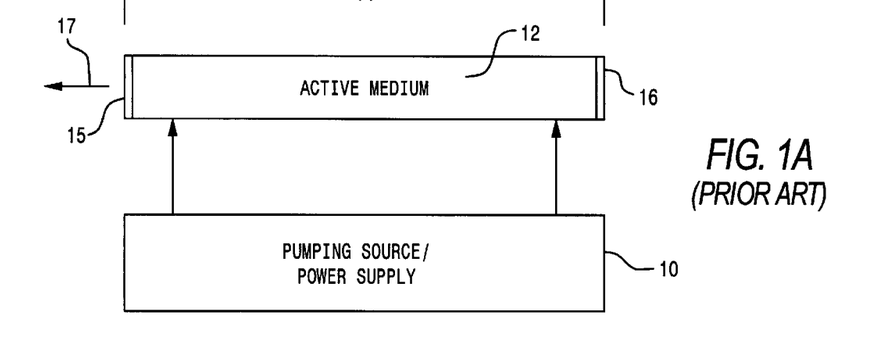
FIG. 1a diagrammatically illustrates the components of a conventional laser.

FIG. 1a diagrammatically illustrates the general construction of a conventional laser as comprising three major components: i—a power supply 10, also called the pumping source; ii—an active medium 12; and iii—an optical cavity 14. The power supply 10 supplies power necessary to 'pump' or stimulate the active medium 12 to amplify light passing through it. The optical cavity 14 is usually defined by two end mirrors 15 and 16 which are parallel to each other, with one (e.g., mirror 16) being totally reflective, and the other (e.g., mirror 15) being a partial reflector, or laser beam output coupler. The surfaces of the two mirrors are usually coated with multiple layers of metal and/or dielectric materials, so that mirror 16 provides total reflectivity at one end of the cavity, and mirror 15 provides a predetermined degree of partial reflectivity at the other end of the cavity from which the laser light exits the active medium 12.

The laser's cavity-defining mirrors reflect the laser light back and forth through the active medium so as to amplify the intensity of light within the cavity. That portion of the light which passes through the partial reflector 15 forms an output laser beam 17. The power supply or pumping source may comprise any of a variety of energy sources, such as, but not limited to, flash lamps, other lasers, or electric power supplies that produce current in semiconductor diodes or plasma discharges in a fluid, such as a gas within the optical cavity. The active medium can comprise a gas, a solid, or liquid.

Where the laser architecture is configured as a discharge gas laser structure, it usually requires a continuous gas flow, or frequent gas refills, as the vacuum components release impurity gases, or the discharge induces chemical reactions to change the gas composition. A sealed gas laser, on the other hand, does not require a continuous flow of lasing gas. While it may require gas refills, the interval between refills may vary from hours to many years. However, a sealed gas laser entails more stringent manufacturing conditions in terms of material choice, cleanness, etc. In addition, the laser structure normally incorporates a gas reservoir to increase the amount of gas in order to maintain a long laser lifetime.

In continuous flow gas lasers and lasers that can be sealed for a short time, as from a few days to even a few months, there usually is a pressurized gas tank connected with the laser and containing a large amount of lasing gas. In a continuous flow gas laser system, the gas flow connection is typically made through a small orifice, so that fresh lasing gas may be continuously supplied through the orifice during laser operation.

Where the laser is of the type that is to be sealed for a period of time—hours, days, or even months—the connection with gas tank is isolated by a closed valve during laser operation. Used gas is pumped out at regular intervals, when the laser is not in operation, and fresh lasing gas is refilled into the laser. In a long-term sealed laser, there is usually no pressurized tank accompanying the laser system. Any necessary lasing gas refill is performed at the factory because the intervals between refills are long. It should be pointed out that, in a sealed gas laser structure, the lasing gas supply reservoir and the active gas medium region are openly coupled to each other at all times at equal pressure. The lasing gas supply reservoir's function is to increase the amount of gas of a single gas fill, and hence increase the laser lifetime per gas fill. The pressurized gas tank serves to supply fresh lasing gas continuously or repeatedly to the laser system.

Figure 2:
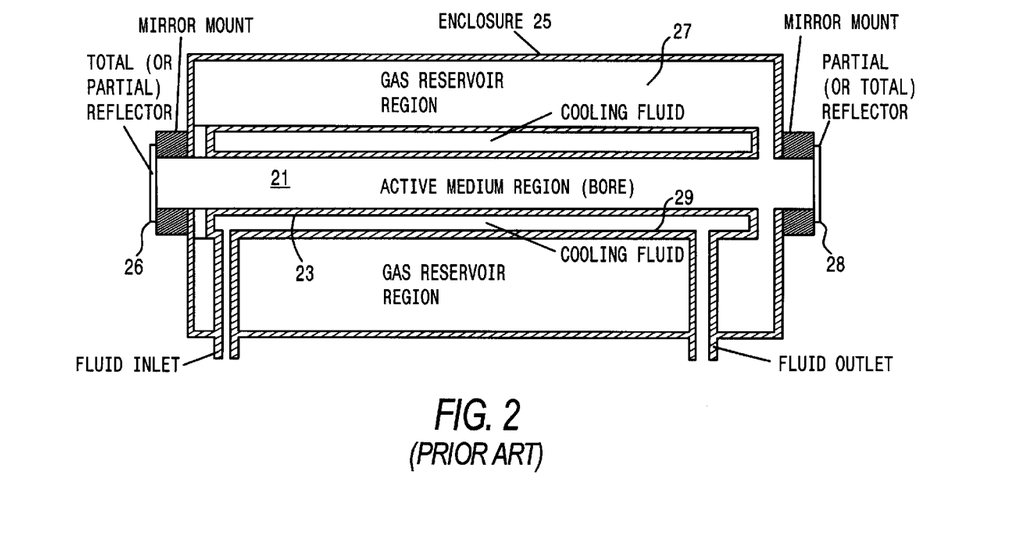
FIG. 2 diagrammatically illustrates a conventional sealed gas laser having a gas reservoir and a cooling jacket.

FIGS. 1 and 2 diagrammatically illustrate different configurations of a conventional sealed gas laser. FIG. 1 shows a gas laser structure that does not require fluid cooling, and may comprise a HeNe laser, various ion lasers, conduction or diffusion cooled lasers and optically pumped far infrared lasers. FIG. 2 illustrates a gas laser architecture, such as one using carbon monoxide or carbon dioxide as the active medium, that requires fluid cooling (such as through the flow of water or an antifreeze solution), usually through an arrangement of cooling tubes or jackets 29 closely integrated with the active laser bore and/or the pumping source.

In each of these laser architectures, the active medium of the laser comprises a lasing gas 21 that is present within a central region, channel or bore 23 of an enclosure 25, that also includes a lasing gas supply reservoir 27 surrounding and openly coupled with the central active region bore 23. The lasing gas can be pumped by means of electrical discharge, either longitudinally or transversely, or can be pumped by optical irradiation. Cavity mirrors are shown at 26 and 28.

In a conventional cooled discharge laser architecture, since the lasing gas reservoir is integrated with the active laser medium components, the structure has a relatively complex design and a relatively large cross-sectional dimension. This gives rise to substantial technical complexity in the design of the laser. One problem is the fact that the straightness or linearity of the active laser bore is not easy to maintain when the design is complex. Another problem is that the materials must have closely matched rates of thermal expansion.

In the case of direct current (DC) discharge, the gas discharge electrical impedance of a volume of discharging gas is negatively dynamic, and decreases as the discharge current increases. For a continuous wave (CW) DC discharge, the electrical current must be actively stabilized due to the negative impedance; otherwise a run-away or oscillation of the discharge will occur. This means that the DC power supply must employ a feedback control mechanism to monitor the electric current dynamics. Using this feedback, the power supply is able to quickly adjust the output voltage to reverse at the onset of current run-away. Unfortunately, an electric power supply with feedback and adjustment is relatively difficult to design and expensive to manufacture.

To help stabilize the CW DC discharge, a high resistance ballast resistor can be placed in series with the gas discharge, since the voltage drop across the resistor will reduce the tendency of discharge run-away (or oscillation). For example, when the discharge current is increasing at the same time as the gas discharge impedance is decreasing rapidly, the higher current will cause the voltage drop on the ballast resistor to increase. The voltage on the gas discharge section will then decrease, reversing the increase in current trend. A drawback in using a ballast resistor is the fact that large amount of energy is converted into wasted heat in the ballast resistor. In a short pulsed discharge, run-way or oscillation is not a problem. Run-away or not, each pulse ends very quickly, prior to any damage to the power supply or anything else.

In a pulsed laser, the laser medium is excited by pulsed pumping, so that the laser output will also be pulsed. The laser pulse duration will not necessarily be the same as that of the pumping pulse. In particular, the laser pulse has a minimum duration. This means that the laser output will stay at a constant duration even when the pumping pulse duration is considerably shorter than this minimum laser pulse duration. This minimum intrinsic laser pulse duration is dependent only on characteristics of the laser design, such as the gas pressure, cavity configuration, etc.

A linearly polarized laser beam is needed in many applications. Mechanisms to provide a polarized laser output beam include the use of a Brewster window, a wire Grid, a brazed grating, etc. Each of these mechanisms usually requires the installation of an additional component to constrain the laser beam to be polarized. The additional component adds expense, complexity, and space to the laser device. It also introduces additional loss to laser light amplification, resulting in lower laser output power.

A $TEM_{00}$ mode laser produces a single spot laser beam, also called a fundamental Gaussian mode laser beam. This laser mode is frequently desirable because of its high energy concentration, coherence, and stability.

SUMMARY OF THE INVENTION

In accordance with a first aspect of the present invention, there is provided a new and improved sealed gas laser, in which the lasing gas medium is allowed to be physically separated from, but is in fluid communication with a gas reservoir by means of flexible or semi-flexible tubing. The use of such tubing allows the laser per se and the gas reservoir to be manufactured separately and then connected by the tubing, thus simplifying the design and manufacturing process. Also, the reservoir and active medium can be located separately or together.

Pursuant to a second feature of the invention, the laser is operated as a pulsed gas discharge laser, where DC discharge is employed, to produce a continuous laser output. Continuous wave (CW) laser radiation is achieved by the rapid repetition of short pulses of gas discharge, using a simplified electric power supply. Laser radiation can be achieved by the use of sufficiently short duration discharge pulses and a high enough repetition rate, such that the electric discharge pulses remain separated; yet the laser pulses produced by the electric discharge pulses will merge together to form CW radiation.

In accordance with a third feature of the invention, one or both of the laser cavity mirrors are configured to constrain the laser radiation to be linearly polarized. This linear polarization constraint is readily achieved by parallel lines on either or both mirrors. Such parallel lines are formed by etching or cutting away lines of one or more layers of metallic or dielectric coatings on the mirror surfaces, or by forming additional lines of metal or dielectric materials on the surfaces through masking or etching. The resulting linear polarization of the laser output beam is due to the fact that linearly polarized light in a given direction with respect to the direction of the lines will have a higher reflectance than that of light polarized perpendicularly. The use of such polarizing mirrors may be applied to both gas and non-gas lasers.

According to a fourth aspect of the invention, the enclosed volume of the active lasing medium has a stepwise or tapered structure, which permits selection of the most desirable $TEM_{00}$ mode. In such a structure, the $TEM_{00}$ mode has the lowest loss compared with other laser modes; namely the loss differences between $TEM_{00}$ mode and other modes are large. The high losses of the other modes prohibit effective amplification of their light intensities, causing the $TEM_{00}$ mode to become the dominant mode. The use of stepwise or tapered enclosure applies for both gas and non-gas lasers.

A fifth feature of the invention involves the use of a double cooling jacket design, which allows one to readily choose the locations of the coolant inlet and outlet.

BRIEF DESCRIPTION OF THE DRAWINGS

FIG. 6b is a timing diagram showing laser pulses with intrinsic duration associated with the electrical discharge pulses of FIG. 6a;

DETAILED DESCRIPTION

Figure 3A:
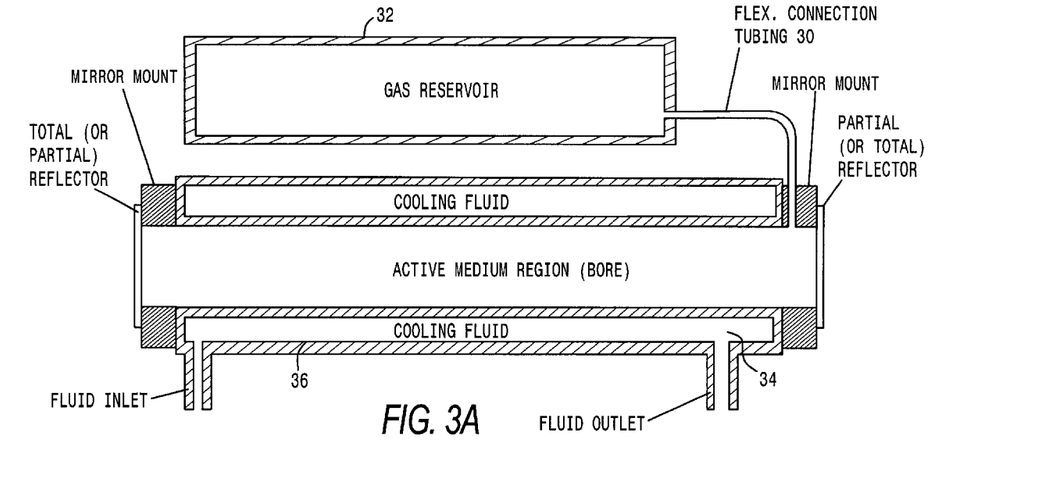
FIG. 3a diagrammatically illustrates a gas laser in accordance with the present invention, having a gas reservoir separate from the laser's cooling jacket and active medium.
Figure 3B:
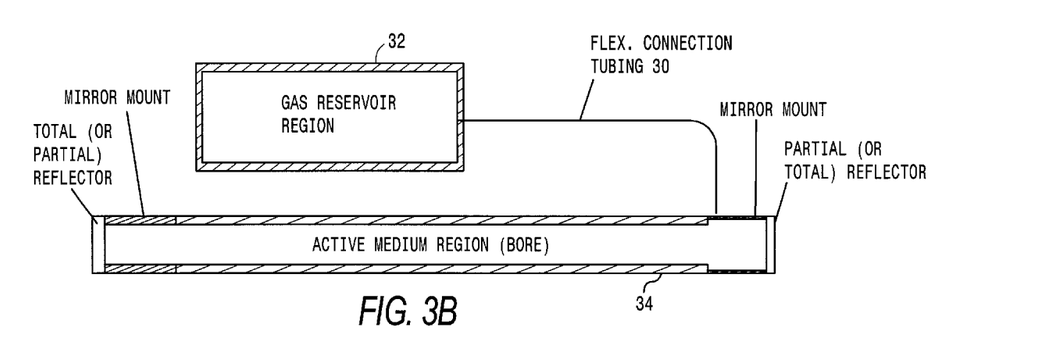
FIG. 3b diagrammatically illustrates a gas laser in accordance with the present invention, having a gas reservoir separate from the laser's active medium and having no cooling jacket.
Figure 4A:
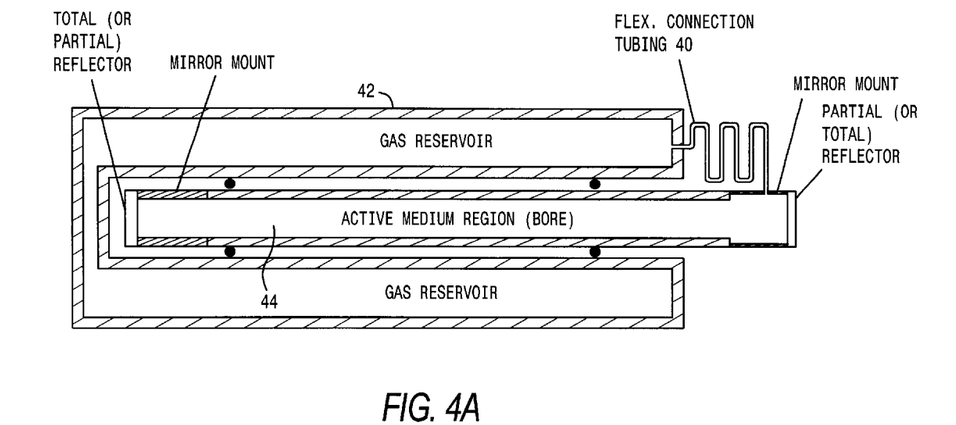
FIGS. 4a–4c diagrammatically illustrate a gas laser of the present invention having separate gas reservoirs packed together with the laser tubes/bores of the active medium, and mirror mounts and mirrors supported by the tubes of active medium (laser bores), or on the reservoirs.
Figure 4B:
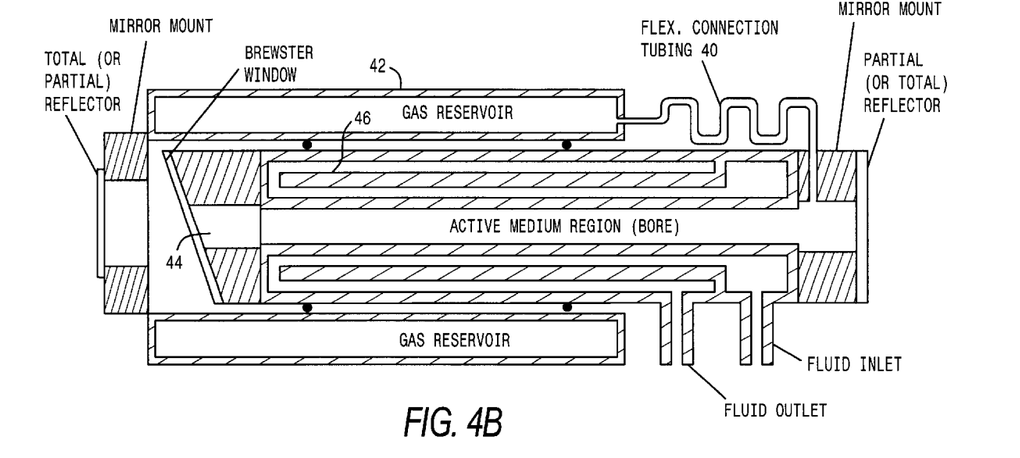

Reference is now directed to FIGS. 3a, 3b and 4a–4d, which diagrammatically illustrated a first aspect of a gas laser in accordance with the present invention, in which the lasing gas supply reservoir is separated from the active gas medium by means of a flexible or semi-flexible tubing. As shown therein, respective lengths of flexible tubing or conduit (shown at 30 in FIGS. 3a and 3b and 40 in FIGS. 4a–4d) are used to provide a lasing medium (gas) connection between one or more lasing gas supply reservoirs 32/42 and laser bores 34/44. These lengths of lasing gas supply tubing can have many configurations and sizes. FIGS. 3a and 4b also show respective cooling fluid structures 36, 46 surrounding the laser bores 34, 44.

As a non-limiting example, the gas supply tubing sections 30/40 may comprise highly flexible capillary metal tubes having outer diameters ranging from 0.1 mm to 5 mm. Also high purity and cleanness plastic tubing, made of a material such as Teflon, may be employed. A first material can be used for the laser bore or tubing enclosing the active gas medium, while another material may be used for the reservoir that contains most of the gas. For example, glass or ceramic can be for the active medium bore, and extruded metal may be used for the lasing gas supply reservoir.

Figure 4C:
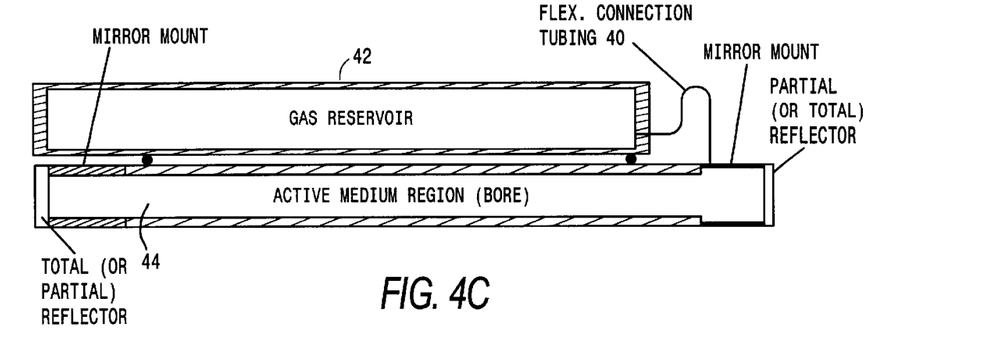

FIGS. 3a and 3b show the lasing gas supply reservoirs 32 physically separated from the active medium 34. The separation distance between the two can be short or long. FIGS. 4a–4c shows laser configurations in which the lasing gas supply reservoirs 42 and the laser active medium bores or tubes 44 are arranged in a spatially 'nested' arrangement, or 'packed together'. Although packed together, the reservoirs are still built separately from the laser bores or tubes, thereby simplifying the design and manufacturing process.

Figure 4D:
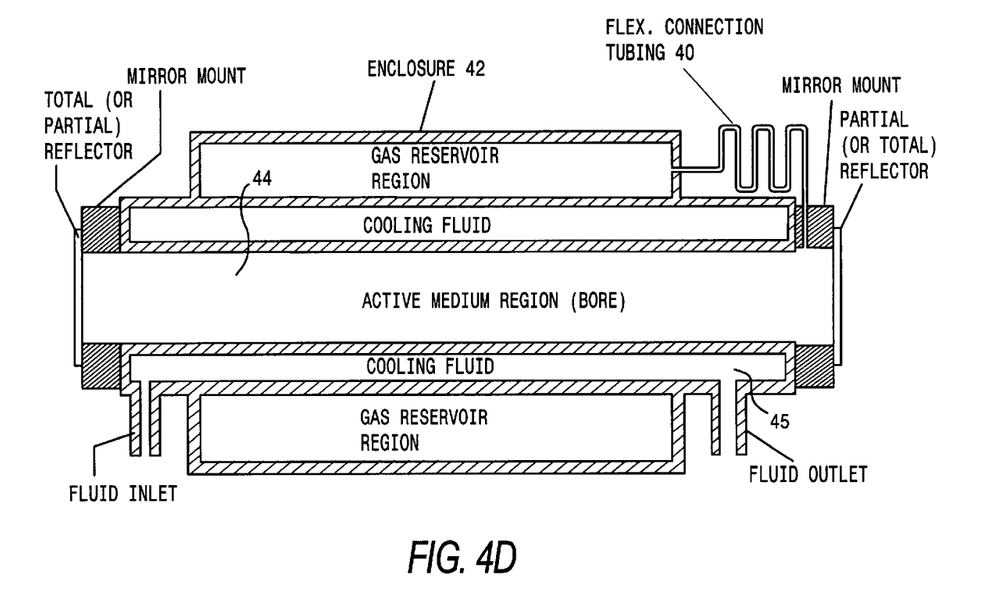
FIG. 4d diagrammatically illustrates a gas laser of the present invention having an integrated gas reservoir with an active medium, with a simplified structure owing to the use of a flexible thin tubing for the fluid connection.

FIG. 4d diagrammatically illustrates a laser configuration in which the laser active medium 44, cooling fluid (water jacket) 45, and gas reservoir 42 are integrated together. The structural configuration of this gas laser is simpler than the conventional gas laser structure of FIG. 2, as the gas reservoir and active medium do not need to be in fluid communication, since the fluid connection is effected by a section of thin flexible tubing 40.

Figure 5A:
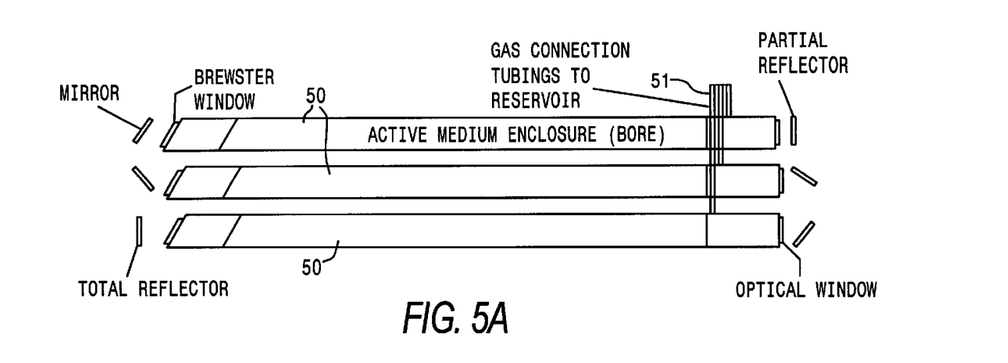
FIGS. 5a–5c diagrammatically illustrate compact folded cavity gas lasers having separate gas reservoirs.
Figure 5B:
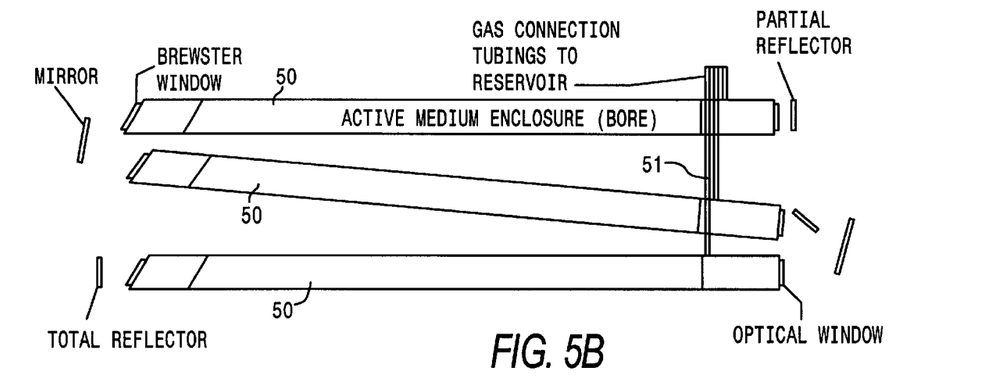
Figure 5C:
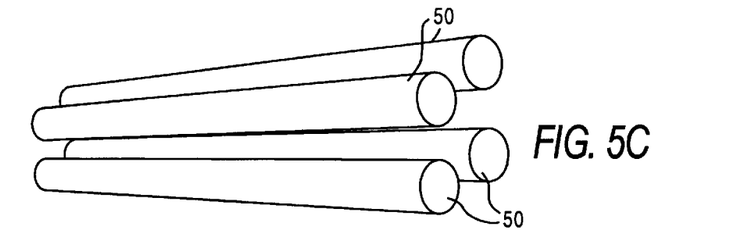

FIGS. 5a–5c show arrangements of relatively 'slender' or generally longitudinally (e.g., narrow cylindrically) configured gas tubes 50 for containing the active lasing gas medium. Because of their relatively slender shape, a plurality (e.g., two to a very large number) of lasing gas bores or tubes can be packed together to form a compact 'folded' laser arrangement. Lasing gas supply conduits 51 couple the lasing gas bores to their associated gas reservoir(s). In FIGS. 5a and 5b, the cooling jackets, the coolant inlets and outlets, and the lasing supply gas reservoirs are not shown for simplicity and clarity. FIG. 5c shows the laser bores or tubes 50 arranged without the reservoir, the mirrors, or the coolant components. Although round or cylindrically shaped laser bores are shown, as non-limiting examples, other bore configurations, such as lasing gas tubes having a regular or irregular polygonal shape, may be employed.

Among advantages of the above configurations for separating the lasing gas supply reservoir from the active laser bore are simplicity, thereby reducing cost compared to a conventional design. The lasing gas supply reservoir may be located in the power supply unit, or in the cooling subsystem, etc., with the reservoir-to-bore connection tubing following a path along electrical wires or coolant supply hoses. Because the lasing gas supply tubing allows the lasing gas reservoir to be located apart from the laser's active gas medium (laser bore), namely at a location where usually there is ample space, it can be built to a relatively large size for extended laser lifetime.

The laser bore can be configured to have a very slender shape, so that it can be placed on an articulated delivery arm. Also, due to its greatly reduced size and weight, the laser bore can be mounted on a moving platform or arm of a beam scanner, thereby obviating the need to move a workpiece upon which the laser beam is incident. The reduced size and weight of a slender laser bore also allows an operator to more comfortably hold the laser, where the laser is configured as a hand-held device. This coupled with the fact that a large reservoir is employed greatly increases the lifetime of the laser, without having to increase the weight and size of what is held in the operator's hand.

Since the laser bore and its gas supply reservoir can be made separately and of different materials, both may have relatively simple structural configurations, thereby significantly reducing their manufacturing cost. In the configurations of FIGS. 4a and 4b, a mechanically stable material is preferably used for constructing the gas supply reservoir, where it is to support the active gas medium and the mirror mounts, thereby improving the stability of the laser output.

A laser having the folded laser design configuration, such as shown in FIGS. 5a–5c, readily lends itself to being manufactured at a relatively low cost, since each laser bore is a very simple and inexpensive part, as is the lasing gas supply reservoir or reservoirs. Also the folded laser design provides for a very compact architecture, since each bore has a relatively slender or narrow shape. In contrast, if the prior art structures of FIGS. 1 or 2 were used to build a folded laser architecture, the resulting design would be considerably bulkier than those shown in FIGS. 5a–5c. It may also be noted that although a single lasing gas supply reservoir may be coupled to each of the bores of a multiple laser bore configuration, more than one reservoir may be used (e.g., each bore may be supplied from its own dedicated lasing gas supply reservoir).

Figure 6A:
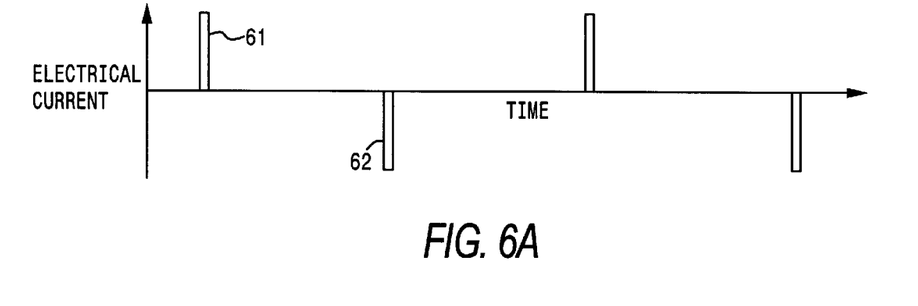
FIG. 6a is a timing diagram showing short electrical discharge pulses.
Figure 6B:
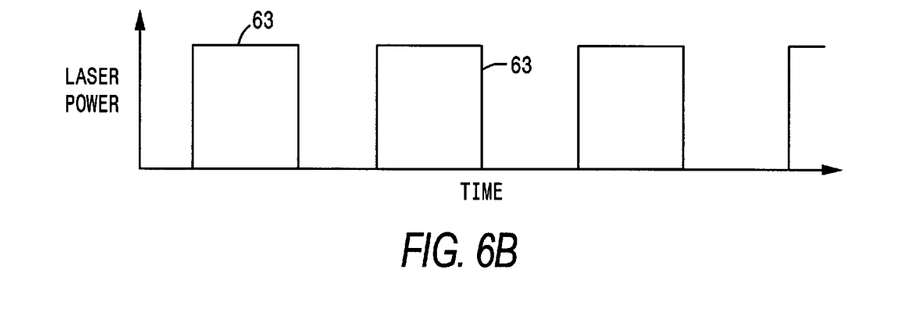

In the operation of the pulsed gas discharge laser for producing a continuous laser output, alternating negative and positive polarity current pulses diagrammatically illustrated at 61 and 62 in FIG. 6a (having a square wave shape as a non-limiting example for simplicity) may be applied to anode and cathode terminals, respectively, of the gas discharge tube, so as to produce the laser pulses shown at 63 in FIG. 6b.

Figure 7A:
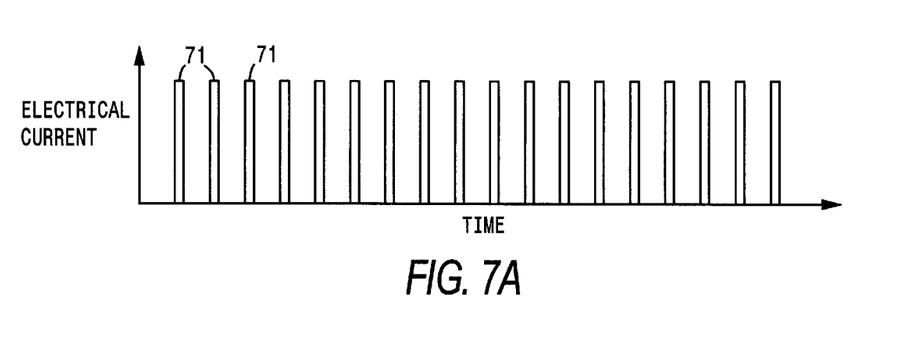
FIG. 7a is a timing diagram showing a rapid pulse train of electrical discharge pulses.
Figure 7B:
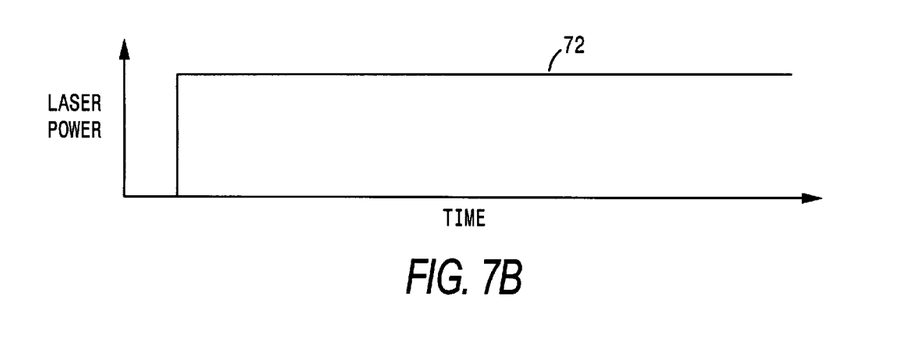
FIG. 7b is a timing diagram showing a laser output as a continuum in association with the rapid electrical discharge pulse train of FIG. 7a, in which the laser pulses merge together.

Since the duration of each electric discharge pulse is considerably shorter than that of the laser intrinsic pulse duration, as shown in FIG. 7a, the repetition rate of the electric discharge pulses 71 can be relatively high without completely merging the adjacent electric discharge pulses together; yet, the laser pulses merge into a continuum or continuous wave (CW) beam output, shown at 72 in FIG. 7b. (It will be readily understood to those skilled in the art that electric current pulses and laser pulses may have a variety of shapes different from those shown in FIGS. 6a and 7a.)

Where the electric discharge pulses have a very short pulse duration, it is not necessary to actively stabilize the discharge in the case of DC discharge, since the discharge ends quickly before major run-away occurs. In this pulsed discharge embodiment, a relatively simple DC electrical power supply may be employed, since there is no need to actively stabilize the discharge. A continuous wave laser output can be made to have the same output power level as that of a similar laser pumped by continuous electric current, by simply making each pulse of electric current a high energy pulse.

Among the advantages of producing a continuous wave laser output by the use of pulsed electric discharge are the following. The architecture does not require a current-stabilization feedback circuit in the power supply using a ballast resistor to save energy and reduce the wasted heat generation problem. In addition, discharge run-away and oscillation caused by negative impedance electrical efficiency cost is avoided, as a result of the simplified power supply design—allowing a rapid laser on and off modulation. Also, the size of the power supply can be reduced, so that it can be more easily integrated into the housing of active medium and/or lasing gas supply reservoir.

Figure 8:
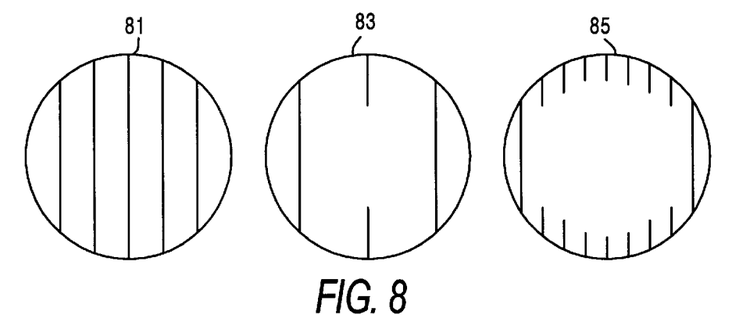
FIG. 8 shows a set of respectively different patterns of mirrors that will induce a polarized laser output.

As described briefly above, a set of relatively fine, linear polarization-defining lines may be formed on either or both of the laser cavity mirrors, so that the laser output beam will be constrained to have linear polarization. FIG. 8 shows a set of respectively different line patterns 81, 83 and 85 that can be coated on mirrors for this purpose to induce a linearly polarized laser output beam. The linear polarization effect is due to the fact that linearly polarized light in a given direction with respect to the direction of the lines will have a higher reflectance than that of light polarized perpendicularly.

The patterns of linear polarization constraining lines may be formed, for example, by etching or cutting away a set of straight lines or grooves in the metal coating material that defines the reflective surface of a laser cavity mirror. If dielectric coatings are formed on the metal coatings, the dielectric coatings can either cover the lines in the metal surface, or have grooves or lines aligned with the lines in the mirror's metal coating.

The reflection of light from the cavity mirror's metallic surface coating results from the oscillation of free electrons induced by the electromagnetic field of the light. Since, in the vicinity of the lines, electrons cannot move and oscillate perpendicular to the lines, due to the absence of metal, reflection is low for light having polarization perpendicular to the lines. On the other hand reflectance is virtually unaffected for light polarized parallel to the lines, where the widths of the lines are narrow, preferably near the order of the laser light wavelength. Thus, the direction of polarization of the laser output beam will be parallel to the lines.

In most cases, lines formed in the outer surface region of the mirror coating are sufficient to cause the laser light beam to be linearly polarized. It is advantageous and preferred to have the lines formed in the outer surface region, since the laser beam intensity in this region is relatively low, thereby reducing the power loss absorbed by the lines. A principal advantage of employing the linear polarization mirror line scheme of the invention is the fact that it eliminates the need for Brewster windows, wire grids, gratings, or other polarizing elements that would otherwise increase laser size, complexity, and cost.

Figure 9:
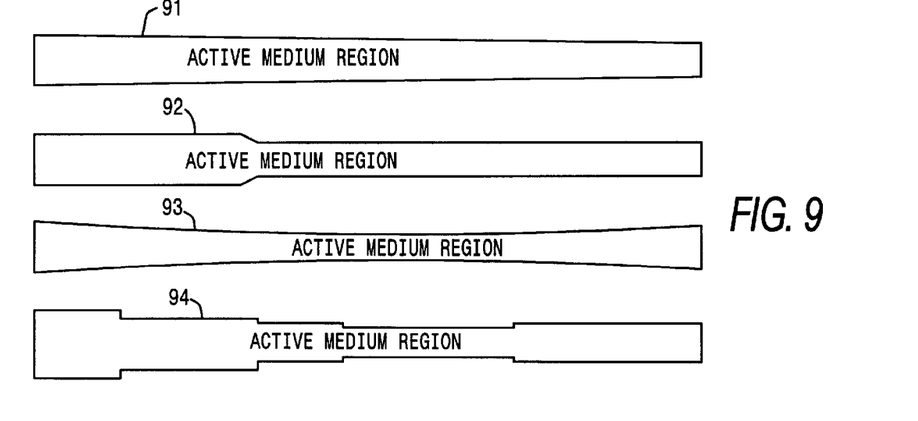
FIG. 9 shows a set of different stepwise and tapered active medium volumes for selecting the $TEM_{00}$ mode.

FIG. 9 shows a set of four non-limiting examples of respectively different stepwise and tapered active medium enclosure volumes 91–94 for defining the laser output mode as $TEM_{00}$ mode, which has the lowest loss compared with other laser modes. The high losses of the other modes prohibit effective amplification of their light intensities, causing the $TEM_{00}$ mode to become the dominant mode. The use of stepwise or tapered enclosure applies for both gas and non-gas lasers. The stepwise or tapered volumes of active media is designed in accordance with the $TEM_{00}$ Gaussian beam profile, as determined by the laser cavity structure, so as to limit light amplification of other modes that have different and unfit profiles. Among the advantages of the use of a stepwise or tapered enclosure is the fact that it eliminates the need to otherwise employ a complicated mirror coating design or intra-cavity apertures for selecting the $TEM_{00}$ mode.

Figure 10A:
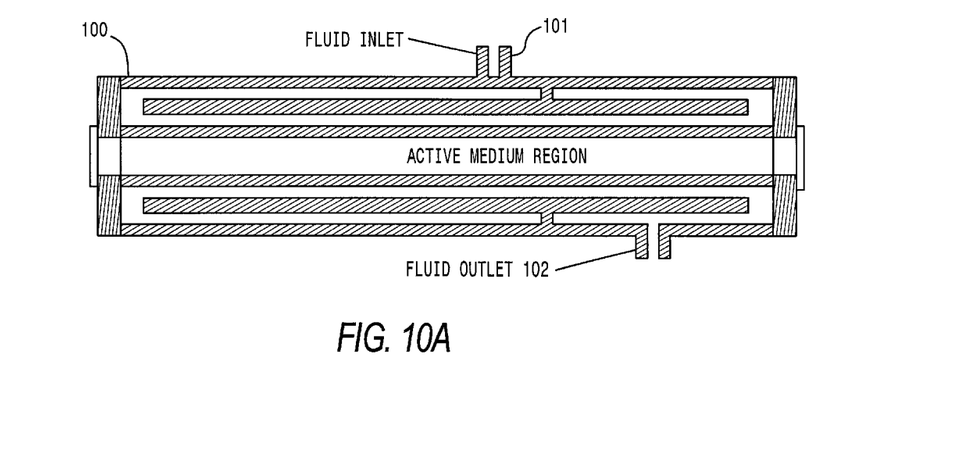
FIGS. 10a and 10b shows respective examples of a double jacketed laser cooling architecture that allow placement of cooling fluid inlets and outlets at different places along the axis of the laser.
Figure 10B:
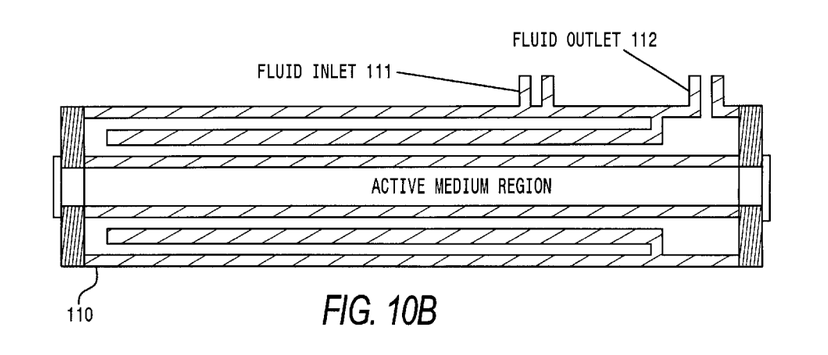

FIGS. 10a and 10b shows respective examples of multiple (e.g., double) jacketed laser cooling architectures 100 and 110 that provide for placement of cooling fluid inlets 101, 111 and cooling fluid outlets 102, 112 at respectively different locations along the axis of the laser's active medium region (optical cavity). Namely, by using a multiple cooling jacket structure, the cooling fluid inlet and outlet can be placed anywhere along the length of the bore/cavity containing the active laser medium.

EXAMPLES

Example I

In a first, non-limiting example of the invention, a relatively low cost, long lifetime, sealed $CO_2$ gas laser operating in a power range of 10–100 W may be constructed using a single straight discharge tube. The discharge tube, which also contains the active medium, may be made of glass, ceramic, metal and the like. The length of the discharge tube may be on the order of from five to one hundred inches, depending upon the output laser power required. The cross-sectional dimension (diameter for a cylindrical tube) typically may range from 0.5 mm to 7 mm, in the case of a waveguide laser, or up to 20 mm in the case of a free space laser. By not integrating the gas reservoir with the laser discharge structure, it is possible to manufacture the discharge laser tube at a fraction of the cost of a conventional laser discharge tube.

A separated gas reservoir may be employed, as diagrammatically illustrated in FIG. 3, using the same or different materials as that of the discharge tube. A relatively simple formation technique is to use an extruded metal tube, such as an extruded aluminum tube. An extruded aluminum tube, such as one have a square or round cross section, may be closed by plates at its two opposite ends, as by welding, o-ring seal, gluing, so as to form a hollow chamber as the gas reservoir. The connection between the discharge tube and the gas reservoir may be effected by means of a section of stainless steel tubing or other metal tubing having an outer diameter on the order of 0.5 mm–2 mm for relatively high flexibility.

The gas reservoir may also support the discharge tube, as shown in FIG. 4. In this 'nested' configuration, the connector tubing can be made thicker with less flexibility, up to several millimeters in diameter, for example, since the discharge tube and the reservoir do not undergo significant relative movement once the laser is fabricated. Whether the reservoir is separate from or formed together with the discharge tube, the cost of the reservoir is low, since it has a relatively basic structural configuration. Extruded aluminum, for example, which is a widely available and relatively low cost material, may be employed.

For $CO_2$ lasers operating in a ten to one hundred Watt power range, for example, the discharge tube must be cooled. To cool the discharge tube without the use of a coolant fluid, as described above, the discharge tube may be placed in contact with heat conducting and dissipating material, such as one or more finned aluminum blocks. This technique is especially effective for lower power $CO_2$ lasers operating at or below one hundred Watts.

Another method is to use a coolant flow arrangement such as that illustrated in FIG. 3a or FIG. 4d. A third method, illustrated in FIG. 4b and FIG. 10, described above, allows the manufacturer to arbitrarily locate the coolant inlet and output ports. For DC discharge $CO_2$ lasers, the coolant flow rate can be as low as 1/20 a gallon per minute (GPM) for a 10 W output, or 1/4 GPM for a 100 W output.

For the discharge mechanism any of a variety can be employed, such as but not limited to a conventional CW discharge to produce a CW laser output, and a pulsed discharge to produce pulsed discharge, using either (longitudinal) DC (direct current), RF (radio frequency), microwave, transverse DC pulsed, or other forms of discharge.

In the case of a DC discharge, the discharge can be pulsed at a high frequency to produce a CW laser output, so that the power supply can have a simpler design. The intrinsic pulse duration is dependent mostly on the gas pressure. For a laser at 30 Torr gas pressure, the intrinsic pulse duration may be on the order of 100 to 200 $\mu$s. With a pressure of 100 Torr, the intrinsic duration is on the order of 20 to 50 $\mu$s. At a 30 Torr pressure for example, the pulse repetition rate should be greater than 5 to 10 KHz in order to produce CW output. The discharge pulse duration should be below the period (inverse of the repetition rate), so that the discharge pulses remain separate pulses.

For a longitudinal laser discharge tube, the discharge current may range from 0.1 mA to 100 mA, depending on the diameter of the discharge tube, and the power output. For example, a 5 mm bore discharge tube requires on the order of 20 mA for full power output, or 1 mA for reduced output power. For transverse discharge tubes, the current is at much higher level, and typically is pulsed.

The dimensions of the discharge tube may vary as need. For example, for the case of a $TEM_{00}$ mode, the active medium (discharge tube) may be configured as shown in FIG. 9. For glass tubes, short tubes of different diameters can be joined together to form a stepwise tube configuration. The joints between the tubes are easily made by first heating the ends of tubes with a blowtorch to melt the glass and then join them. One can also easily make the tapered discharge tube by utilize a standard glass tube technique with which a glass tube is formed over a mandrel. In this case, the mandrel may be configured as a tapered rod. After the glass tube is melted and formed on the mandrel, the mandrel is cooled to shrink to a smaller size, and then pulled out of the glass tube.

Also, ceramic or metal discharge tubes may be either machined or pre-formed as varying diameter tubes. The amount of diameter variation is dependent on the Gaussian laser beam profile, which is dependent on the laser cavity configuration. Calculating the Gaussian beam profile base on the cavity structure, one can easily determine the variation of diameter of the discharge tube. The cavity structure includes the radii of curvature and spacing of the mirrors, the laser's total reflector mirror and its partial reflector mirror.

When a polarized laser output is needed, a polarizing mirror design as described above may be used. For a $CO_2$ laser, the lines shown in FIG. 8 can be formed either as a discontinuous (missing) metal coating on the total reflector mirror, which usually has a continuous metal coating, or added metal coating lines on the partial reflector, which conventionally has no metal coating. In the case of missing metal lines on the total reflector, the polarization direction of the laser beam will be parallel to the lines. In the case of added metal lines, the polarization direction will be perpendicular to the metal lines.

As spacing of 0.5 mm to 10 mm between the lines is sufficient to polarize the laser beam. Generally, a large spacing up to 10 mm may be used for larger discharge bores. While higher density lines (below 0.5 mm) may be more effective in polarizing the beam, they may introduce a loss unless the line width is less than the wavelength, i.e., below 10 $\mu$m. The line width should be as narrow as possible for low loss introduced to the laser oscillation (amplification by the active medium). From a practical standpoint, a line width in the range of 5 $\mu$m to 0.5 mm is sufficient. While a 0.5 mm width will not cause too high a loss for a large bore having a long discharge length and high output laser power, it may subject the mirror(s) to substantial heating.

The gas pressure will typically vary with the diameter of the discharge tube for both longitudinal and transverse discharge tubes. For a longitudinal DC, RF, or microwave discharge tube, the gas pressure may be in a range of 5 Torr to 250 Torr, depending on the diameter. For example, the optimal pressure for a 3 mm discharge bore is 70 to 100 Torr. The optimal pressure for a 10 mm bore is 15 to 40 torr. For a transverse, short pulsed DC discharge, the pressure may be from about 300 Torr to above atmospheric pressure (i.e., over 760 Torr).

The gas composition of a $CO_2$ laser gas mixture consists primarily of helium (He), nitrogen ($N_2$), and carbon dioxide ($CO_2$). Active carbon dioxide molecules at a prescribed high energy level are the active medium for producing laser radiation (thus, the name $CO_2$ laser). He is employed for conducting heat to the wall of the tube and therefore for cooling the electrical discharging gas mixture, and nitrogen is used to efficiently transfer the electrical energy in the discharge to the carbon dioxide molecules. Typically, carbon dioxide gas has about 4 to 20% concentration (most common near 15%). Nitrogen has about 10 to 20% concentration (most common 15%). The remaining gas is almost all helium. A small amount of a few different gases (5% or less all together) can be added to sealed $CO_2$ lasers to prolong lifetime.

The laser's wavelength can be fixed at a predetermined value within a 9 $\mu$m to 11 $\mu$m range (typically at 10.6 $\mu$m for highest output power), or it can be tuned in the range of 9 $\mu$m to 11 $\mu$m when a grating(s) or prism(s) is used.

Example II

Using the parameters of the first example described above, a low cost folded cavity 10 W to 500 W $CO_2$ laser can be constructed as shown in FIG. 5. For example, a low power folded $CO_2$ laser, e.g., at 25 W, may be used for applications where a short laser is needed, as a 25 W $CO_2$ laser having a single discharge tube might be too long to be used as a hand-held laser. In a folded configuration, the laser may be short enough and small enough to be hand-held, while its sealed-off gas reservoir is located separately away from the laser head.

It should be noted that fabrication of a folded laser cavity is difficult, even where one is skilled in routinely building single discharge tube lasers. The difficulty results from the fact that there are more mirrors involved, and the mirror alignment becomes very difficult. The more discharge tubes used, the more mirrors required, increasing manufacturing and assembly complexity. Proper instrumentation can facilitate and expedite the folded cavity alignment.

While I have shown and described several embodiments in accordance with the present invention, it is to be understood that the same is not limited thereto but is susceptible to numerous changes and modifications as are known to a person skilled in the art, and I therefore do not wish to be limited to the details shown and described herein, but intend to cover all such changes and modifications as are obvious to one of ordinary skill in the art.

What is claimed is:

1. A laser assembly comprising:
   a housing having an optical cavity containing a lasing medium;
   a pumping source coupled to stimulate said lasing medium to amplify laser light passing through said optical cavity;

at least one lasing medium supply reservoir separate from said housing and storing a quantity of said lasing medium; and a lasing medium supply conduit connecting said at least one reservoir and said housing, and being configured to supply said lasing medium from said reservoir to said optical cavity, and wherein said lasing medium comprises a gas and said supply conduit comprises at least one section of flexible or semi-flexible tubing.

2. A laser assembly comprising:

a housing having an optical cavity containing a lasing medium;

a pumping source coupled to stimulate said lasing medium to amplify laser light passing through said optical cavity;

at least one lasing medium supply reservoir separate from said housing and storing a quantity of said lasing medium; and a lasing medium supply conduit connecting said at least one reservoir and said housing, and being configured to supply said lasing medium from said reservoir to said optical cavity, and wherein said optical cavity and said lasing medium supply reservoir are arranged in a nested configuration.

3. A laser assembly comprising:

a housing having an optical cavity containing a lasing medium;

a pumping source coupled to stimulate said lasing medium to amplify laser light passing through said optical cavity;

at least one lasing medium supply reservoir separate from said housing and storing a quantity of said lasing medium; and a lasing medium supply conduit connecting said at least one reservoir and said housing, and being configured to supply said lasing medium from said reservoir to said optical cavity, and wherein said lasing medium comprises a lasing gas, and said pumping source comprises a pulsed DC discharge device which is operative to supply gas discharge-producing pulses to said lasing gas in such a manner as to cause an effectively continuous laser output beam to be emitted from said optical cavity.

4. A laser assembly comprising:

a housing having an optical cavity containing a lasing medium;

a pumping source coupled to stimulate said lasing medium to amplify laser light passing through said optical cavity;

at least one lasing medium supply reservoir separate from said housing and storing a quantity of said lasing medium; and a lasing medium supply conduit connecting said at least one reservoir and said housing, and being configured to supply said lasing medium from said reservoir to said optical cavity, and wherein said optical cavity comprises at least one reflective surface having a pattern of linear polarizationdefining lines formed thereon, so that a laser output beam emitted from said optical cavity is linearly polarized.

5. A laser assembly comprising:

a housing having an optical cavity containing a lasing medium;

a pumping source coupled to stimulate said lasing medium to amplify laser light passing through said optical cavity;

at least one lasing medium supply reservoir separate from said housing and storing a quantity of said lasing medium; and a lasing medium supply conduit connecting said at least one reservoir and said housing, and being configured to supply said lasing medium from said reservoir to said optical cavity, and wherein said lasing medium is confined within a prescribed geometrical shape which varies along the length of said optical cavity.

6. A laser assembly comprising:

a housing having an optical cavity containing a lasing medium;

a pumping source coupled to stimulate said lasing medium to amplify laser light passing through said optical cavity;

at least one lasing medium supply reservoir separate from said housing and storing a quantity of said lasing medium; and a lasing medium supply conduit connecting said at least one reservoir and said housing, and being configured to supply said lasing medium from said reservoir to said optical cavity, and wherein said lasing medium is confined within a prescribed geometrical shape which varies along the length of said optical cavity, such that a $TEM_{00}$ mode laser beam is emitted from said optical cavity.

7. A laser assembly comprising:

a housing having an optical cavity containing a lasing medium;

a pumping source coupled to stimulate said lasing medium to amplify laser light passing through said optical cavity;

at least one lasing medium supply reservoir separate from said housing and storing a quantity of said lasing medium; and a lasing medium supply conduit connecting said at least one reservoir and said housing, and being configured to supply said lasing medium from said reservoir to said optical cavity, and wherein said lasing medium is confined within lasing medium enclosure that is thermally coupled with a multiple laser cooling structure that allows for placement of cooling fluid inlets and outlets at respectively different locations along said optical cavity.

8. A laser assembly according to claim 2, wherein said optical cavity is comprised of a plurality of generally longitudinally configured lasing medium enclosures arranged optically in series with one another between ends of said optical cavity.

9. A laser assembly according to claim 4, wherein said pattern of lines is formed on an outer surface region of at least one mirror defining an end of said optical cavity.

10. A laser assembly according to claim 1, wherein said lasing medium is confined within lasing medium enclosure that is thermally coupled with a multiple laser cooling structure that allows for placement of cooling fluid inlets and outlets at respectively different locations along said optical cavity.

11. A method of fabricating a laser apparatus comprising the steps of:

(a) providing an optical cavity enclosure for a lasing medium;

(b) coupling to said optical cavity enclosure a pumping source that is operative to stimulate said lasing medium to amplify laser light passing through said optical cavity;

(c) providing at one lasing medium supply reservoir, that is separate from said housing;

(d) storing a quantity of said lasing medium in said at least one lasing medium supply reservoir; and (e) coupling a lasing medium supply conduit between said at least one reservoir and said housing, so that lasing medium stored by said reservoir may be fed to said optical cavity.

12. A method according to claim 11, wherein said lasing medium comprises a lasing gas, and said pumping source comprises a pulsed DC discharge device which is operative to supply gas discharge-producing pulses to said lasing gas in such a manner as to cause an effectively continuous laser output beam to be emitted from said optical cavity.

13. A method according to claim 12, wherein step (a) comprises arranging a plurality of generally longitudinally configured lasing medium enclosures optically in series with one another between ends of said optical cavity.

14. A method according to claim 12, further comprising the step of:

(f) coupling to said lasing medium a multiple cooling structure that is configured for placement of cooling fluid inlets and outlets at respectively different locations along said optical cavity.

15. A method according to claim 11, wherein step (a) comprises enclosing said lasing medium within a prescribed geometrical shape which varies along the length of said optical cavity, such that a $TEM_{00}$ mode laser beam is emitted from said optical cavity.

16. A method according to claim 11, wherein said optical cavity comprises at least one reflective surface having a pattern of linear polarization-defining lines formed thereon, so that a laser output beam emitted from said optical cavity is linearly polarized.

17. A method according to claim 16, wherein said optical cavity and said lasing medium supply reservoir are arranged in a nested configuration.

\* \* \* \* \*

UNITED STATES PATENT AND TRADEMARK OFFICE
CERTIFICATE OF CORRECTION

PATENT NO. : 6,263,007 B1
DATED : July 17, 2001
INVENTOR(S) : Fuqian Tang

It is certified that error appears in the above-identified patent and that said Letters Patent is hereby corrected as shown below:

Column 2,
Line 65, delete "run-way" insert -- run-away --

Column 3,
Line 60, delete "perpendicularly." insert -- with respect to the direction of the lines. --

Column 8,
Line 33, delete "gluing," insert -- or gluing, --

Column 9,
Line 23, delete "at much" insert -- at a much --
Line 25, delete "as need." insert -- as needed --
Line 32, delete "by utilize" insert -- by utilizing --
Line 42, delete "profile base" insert -- profile based --
Line 67, delete "5 μn" insert -- μm --

Colum 10,
Line 10, delete "torr." insert -- Torr. --

Column 11,
Line 59, delete "polarizationdefining" insert -- polarization-defining --

UNITED STATES PATENT AND TRADEMARK OFFICE
CERTIFICATE OF CORRECTION

PATENT NO.   : 6,263,007 B1
DATED        : July 17, 2001
INVENTOR(S)  : Fuqian Tang It is certified that error appears in the above-identified patent and that said Letters Patent is hereby corrected as shown below:

Column 12,
Line 54, delete "10. A laser assembly according to claim 1, wherein said lasing medium is confined within lasing medium enclosure that is thermally coupled with a multiple laser cooling structure that allows for placement of cooling fluid inlets and outlets at respectively different locations along said optical cavity." insert
-- 10. A laser assembly according to claim 5, wherein said prescribed geometrical shape of said lasing medium is tapered in one of a linear, non-linear, and stepped manner along the length of said optical cavity. --

Signed and Sealed this

Sixteenth Day of April, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO.    : 6,263,007 B1
DATED         : July 17, 2001
INVENTOR(S)   : Fuqian Tang It is certified that error appears in the above-identified patent and that said Letters Patent is hereby corrected as shown below:

Column 2,
Line 65, delete "run-way" insert -- run-away --

Column 3,
Line 60, delete "perpendicularly." insert -- with respect to the direction of the lines. --

Column 8,
Line 33, delete "gluing," insert -- or gluing, --

Column 9,
Line 23, delete "at much" insert -- at a much --
Line 25, delete "as need." insert -- as needed --
Line 32, delete "by utilize" insert -- by utilizing --
Line 42, delete "profile base" insert -- profile based --
Line 67, delete "5 μn" insert -- 5μm --

Column 10,
Line 10, delete "torr." insert -- Torr. --

Column 11,
Line 59, delete "polarizationdefining" insert -- polarization-defining --

UNITED STATES PATENT AND TRADEMARK OFFICE
CERTIFICATE OF CORRECTION

PATENT NO.   : 6,263,007 B1
DATED        : July 17, 2001
INVENTOR(S)  : Faqian Tang It is certified that error appears in the above-identified patent and that said Letters Patent is hereby corrected as shown below:

Column 12,
Line 54, delete "10. A laser assembly according to claim 1, wherein said lasing medium is confined within lasing medium enclosure that is thermally coupled with a multiple laser cooling structure that allows for placement of cooling fluid inlets and outlets at respectively different locations said optical cavity." insert
-- 10. A laser assembly according to claim 5, wherein said prescribed geometrical shape of said lasing medium is tapered in one of a linear, non-linear, and stepped manner along the length of said optical cavity. --

This certificate supersedes Certificate of Correction issued April 16, 2002.

Signed and Sealed this

Nineteenth Day of November, 2002

*Attest:*

*Attesting Officer*

JAMES E. ROGAN
*Director of the United States Patent and Trademark Office*